United States Patent
Gallo

(10) Patent No.: US 11,653,457 B2
(45) Date of Patent: May 16, 2023

(54) SUBMERSIBLE CONTROL PANEL

(71) Applicant: CUSTOM CONTROLS TECHNOLOGY INC., Hialeah, FL (US)

(72) Inventor: Gerardo Gallo, Hialeah, FL (US)

(73) Assignee: Custom Controls Technology Inc., Hialeah, FL (US)

( * ) Notice: Subject to any disclaimer, the term of this patent is extended or adjusted under 35 U.S.C. 154(b) by 159 days.

(21) Appl. No.: 17/172,301

(22) Filed: Feb. 10, 2021

(65) Prior Publication Data

US 2021/0251092 A1 Aug. 12, 2021

Related U.S. Application Data

(60) Provisional application No. 62/972,395, filed on Feb. 10, 2020.

(51) Int. Cl.
  *H05K 5/00* (2006.01)
  *H05K 5/02* (2006.01)
  *H02G 3/22* (2006.01)

(52) U.S. Cl.
  CPC ............ *H05K 5/0217* (2013.01); *H02G 3/22* (2013.01); *H05K 5/0017* (2013.01)

(58) Field of Classification Search
  USPC ....... 361/807, 728, 752, 796, 800, 799, 816, 361/818
  See application file for complete search history.

(56) References Cited

U.S. PATENT DOCUMENTS

| 4,350,032 A | * | 9/1982 | Kochackis | G07F 9/10 |
| | | | | 70/159 |
| 4,924,038 A | * | 5/1990 | Klosin | H02G 15/013 |
| | | | | 277/626 |
| 10,362,362 B2 | | 7/2019 | Srinivasaraghavan et al. | |
| 2014/0268597 A1 | * | 9/2014 | Lebo | H05K 5/0226 |
| | | | | 361/752 |
| 2015/0282363 A1 | | 10/2015 | Bier et al. | |

FOREIGN PATENT DOCUMENTS

| CN | 213520711 | * | 6/2021 | ............ H02B 1/044 |
| DE | 1675243 | * | 12/2005 | ............ H02G 15/00 |
| GB | 2178909 | * | 6/1985 | ............ H02G 15/00 |
| WO | WO9947763 | * | 9/1999 | ............ A01M 29/34 |

* cited by examiner

*Primary Examiner* — Hung S. Bui
(74) *Attorney, Agent, or Firm* — Laurence A. Greenberg; Werner H. Stemer; Ralph E. Locher

(57) ABSTRACT

A submersible control system with a control panel. The control panel has a frame to house electronic components. The frame has a connection opening for wiring required for an electrical connection to the electrical components. An outer door is attached to the frame to be water-tight to the frame in a closed position thereof. A conduit is sealed to be water-tight with respect to the connection opening. The conduit is filled with an epoxy for water-tight sealing an interior of the conduit to the wiring fed through the conduit. The control panel will remain water-tight for at least 24 hours after being submerged.

13 Claims, 9 Drawing Sheets

SUBMERSIBLE CONTROL PANEL

CROSS-REFERENCE TO RELATED APPLICATION

This application claims the priority, under 35 U.S.C. § 119(e), of provisional application No. 62/972,395 filed Feb. 10, 2020; the prior application is herewith incorporated by reference in its entirety.

BACKGROUND OF THE INVENTION

Field of the Invention

The invention relates, generally, to a submersible control panel for housing electronic components.

Control panels for pump controls for storm and lift stations are subject to harsh environmental conditions including high winds in excess of 175 mph and flooding such as during king tides. In order to avoid flooding, the inventor considered providing control panels that have built in lifting devices which would lift the control panels up to six or more feet upon the detection of water intruding into the area of the control panel. However, it was determined that such a lifting devices would be complex devices and would be subject to failure and thus not reliable. Therefore, there is a need for control panels that have flood proof construction.

Description of the Related Art

U.S. Pat. No. 10,362,362 to Midday discloses a system for environmental sealing of electrical enclosures. The enclosure has interior space that is accessible through an opening. A door or cover selectively closes the opening. The enclosure cabinet is manufactured of numerous parts and has holes, joints, gaps, seams and/or fasteners. Electrical control devices are mounted in the cabinet. To this end, Midday discloses that a thick-film elastomeric coating is on an outer surface of the cabinet. The coating has a thickness of at least 0.6 mm to provide a monolithic bridging layer over holes, joints, gaps, seams and/or fasteners to prevent environmental contamination from penetrating the cabinet. As the coating in a monolithic structure that covers the enclosure, the construction results in a complex coating that is subject to being compromised by any type of damage to the coating, which could occur during installation or flying debris and is thus not suitable for or capable being submersed in water for a prolonged period of time while ensuring that the interior of the cabinet remains free of water.

US 2015/0282363 to Bier discloses an enclosure for submersible network connectors that includes electrode openings that receive electrodes that pass into the top of the cabinet body. The openings each receive a terminal or electrode. The electrode has insulating material (polyester, fiberglass, porcelain, epoxy, etc.) to electrically isolate the terminal/electrode from the cabinet. The insulating material is sealed with respect to the cabinet body by an O-ring or the terminal/electrode is partially encapsulated in a polymeric (e.g., rubber) material that seals and electrically isolates the electrode/terminal. The sealing of Bier is susceptible to leaking at the O-ring or rubber seal to the body.

SUMMARY OF THE INVENTION

It is accordingly an object of the invention to provide a submersible control panel system that overcomes the hereinmentioned disadvantages of the heretofore-known devices of this general type, which are able to remain water-tight for at least 24 hours after being submerged in water and are able to be implemented in flood prone areas.

With the foregoing and other objects in view there is provided, in accordance with the invention, a submersible control system with a control panel. The control panel has a frame to house electronic components the frame has a connection opening for wiring for electrical connection. At least one door is attached to the frame in a water-tight manner. A conduit is sealed in a water-tight manner with respect to the connection opening. The conduit is filled with an epoxy to seal an interior of the conduit in a water-tight manner with respect to electrical wiring passing through the conduit into the frame. The control panel will remain water-tight for at least 24 hours after being submerged.

In accordance with another feature of the invention, the connection opening has a hub welded onto said frame to be water-tight to said frame. The conduit has a threaded connection to said hub.

In accordance with another feature of the invention, a porous material is disposed in said conduit at a bottom end of said conduit. The porous material defines a damper for preventing said epoxy from flowing out of said conduit during filling of said epoxy into said conduit.

In accordance with another feature of the invention, the porous material is a sponge that engages an inside diameter of said conduit.

In accordance with another feature of the invention, the sponge has material properties configured to allow the wires to be pierced through said sponge.

In accordance with another feature of the invention, an inner door is disposed inside said control panel. The inner door divides an interior of said control panel and defines an area behind said inner door to isolate high-voltage components of the control panel.

In accordance with another feature of the invention, rails are disposed on a sidewall of said frame. The rails adjustably mount said inner door in a front to back direction of said control panel.

Additionally, there is provided, in accordance with the invention a method of providing a submersible control system that includes to provide a water-tight control panel with a connection opening for electrical wiring. To provide a conduit and pass electrical wiring through the conduit. To connect the conduit to the opening with a water-tight connection and fill the conduit with epoxy. Seal the interior of the conduit to the electrical wiring.

In accordance with another feature of the invention, prior to the filling step: provide a porous material damper; pierce the wiring through the porous material damper; insert the porous material damper into the conduit and engage an inside diameter of the conduit therewith.

In accordance with another feature of the invention, prior to the filling step: provide a porous material damper as a sprayable foam; spray the porous material damper into the bottom end of the conduit around the wiring and fill a gap between the wiring and an inside diameter of the conduit.

Other characteristic features of the invention are set forth in the appended claims.

Although the invention is illustrated and described herein as embodied in a submersible control panel, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of specific embodiments when read in connection with the accompanying drawings.

DETAILED DESCRIPTION OF THE INVENTION

Figure 1:
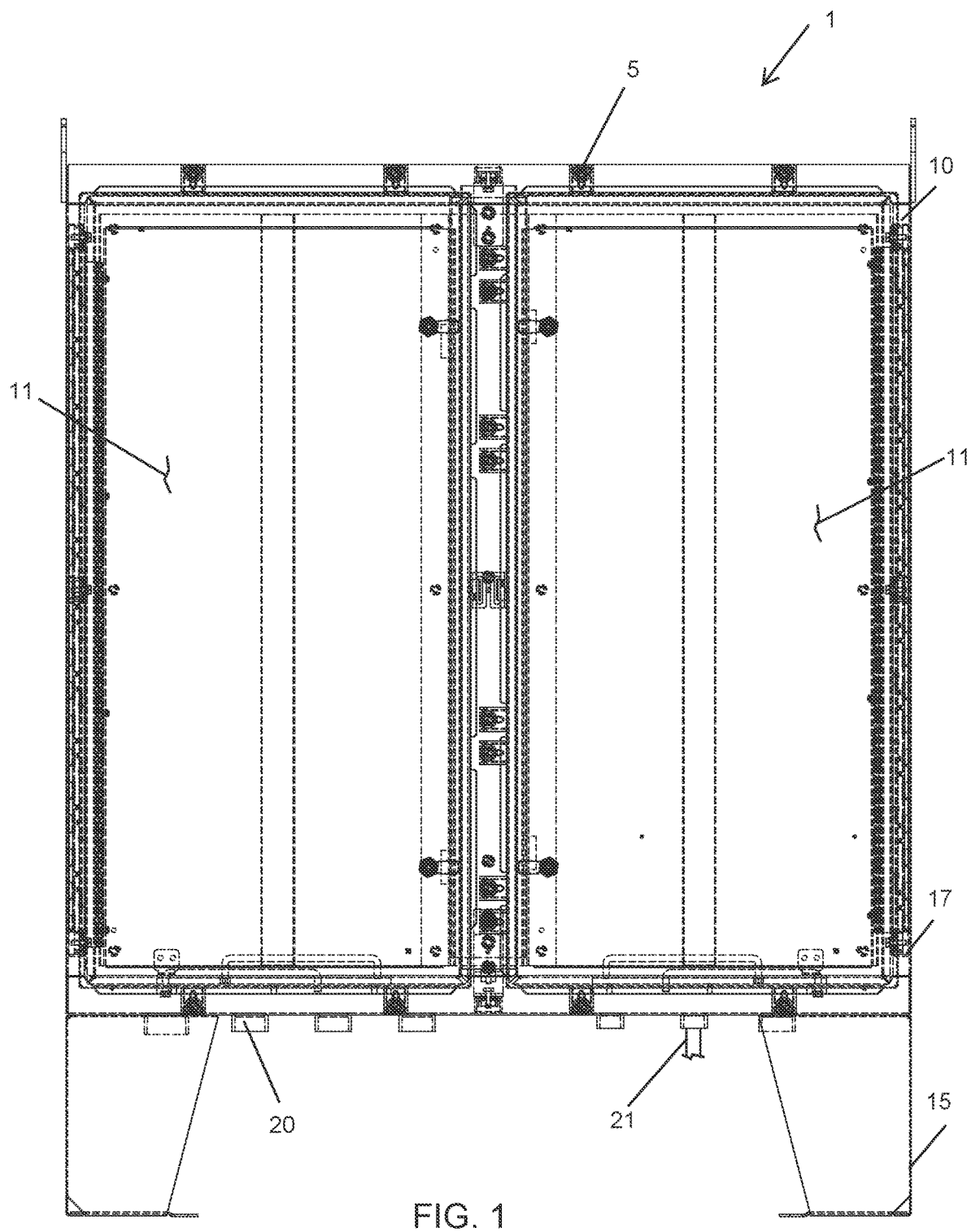
FIG. 1 is a front view of a submersible control panel according to the invention.

In all the figures of the drawing, sub-features and integral parts that correspond to one another bear the same reference symbol in each case.

Figure 2:
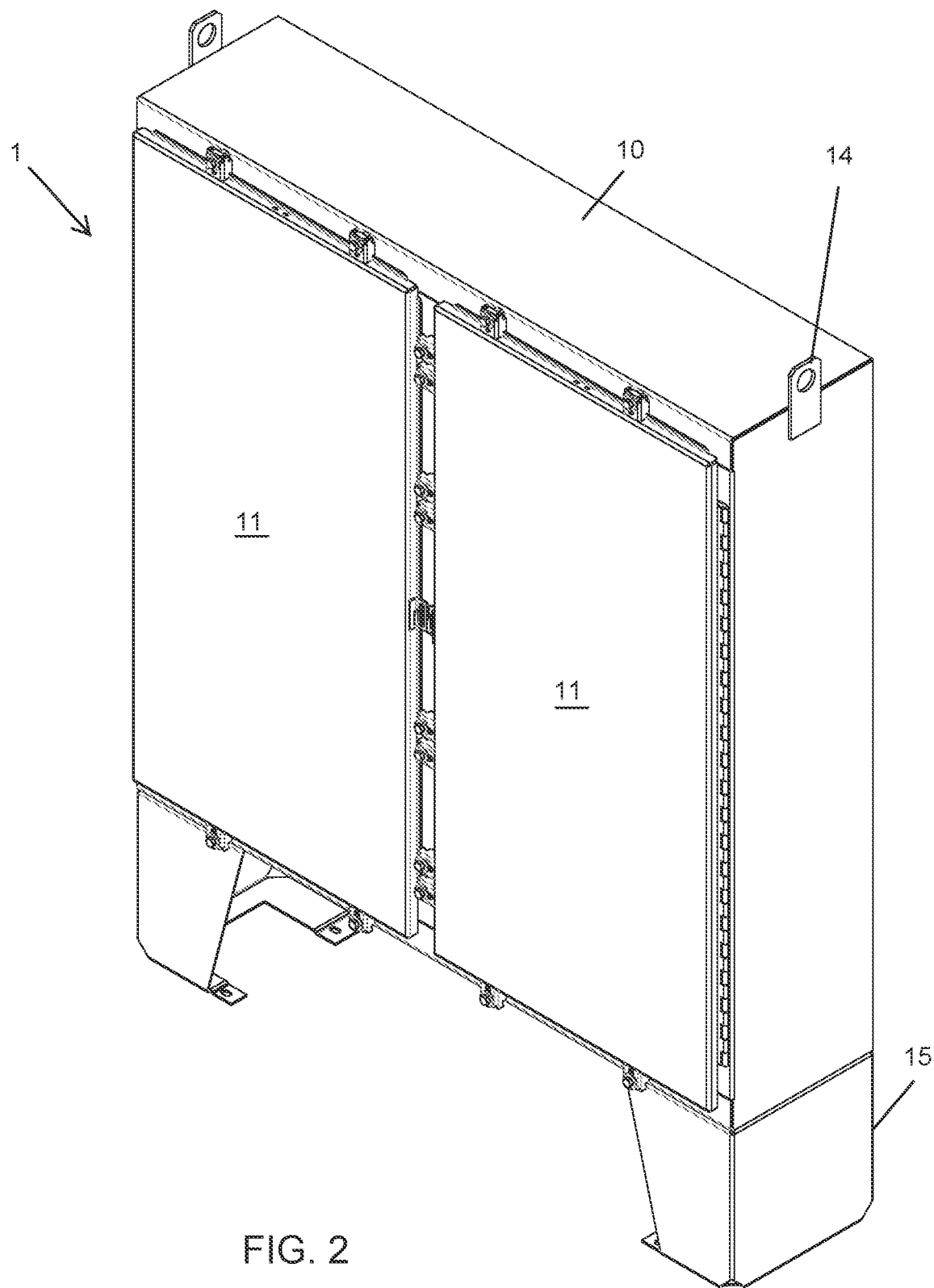
FIG. 2 is a perspective view of the submersible control panel.

Referring now to the figures of the drawings in detail and first, particularly, to FIGS. 1 and 2 thereof, there is shown a submersible control system with a control panel 1. The submersible control panel 1 provides a control system that does not require being installed at the 100 years flood level, namely 1.5 or 2 ft above ground level. In some cases such as the Venetian Islands the control stations are installed a least 8 ft above sea level.

The submersible control panel 1 is constructed to maintain a NEMA 4× rating and be submersible in 6+ feet of water for at least 24 hours and must keep water from entering inside the interior of the control panel 1. The control panel 1 is defined by a frame or body 10 and at least one outer door 11 mounted thereon. The body 10 and door(s) are preferably manufactured of 12 gauge 316L stainless steel. The body encloses five side of a rectilinear volume. The body 10 has an opening which is closed by the door(s) 11 and a center post 12 vertically spans the opening and acts as a mullion for the doors 11 when two doors are provided.

The doors 11 are attached to the body 10 of the control panel 1 in a water-tight manner by continuous hinges running the length of the doors 11. The doors 11 are provided with seals about the periphery thereof that seal the doors 11 in a water-tight manner for submersion of the panel. In addition, electrical connection via conduits 21 are also epoxy sealed to prevent the penetration of water. The doors 11 are secured by screw clamps 5 disposed along three sides of the doors 2. A key locking handle can be provided on the doors 11. The body 10 has stainless steel welded legs or floor stands 15 at opposing ends of a base of the body 10.

Figure 3:
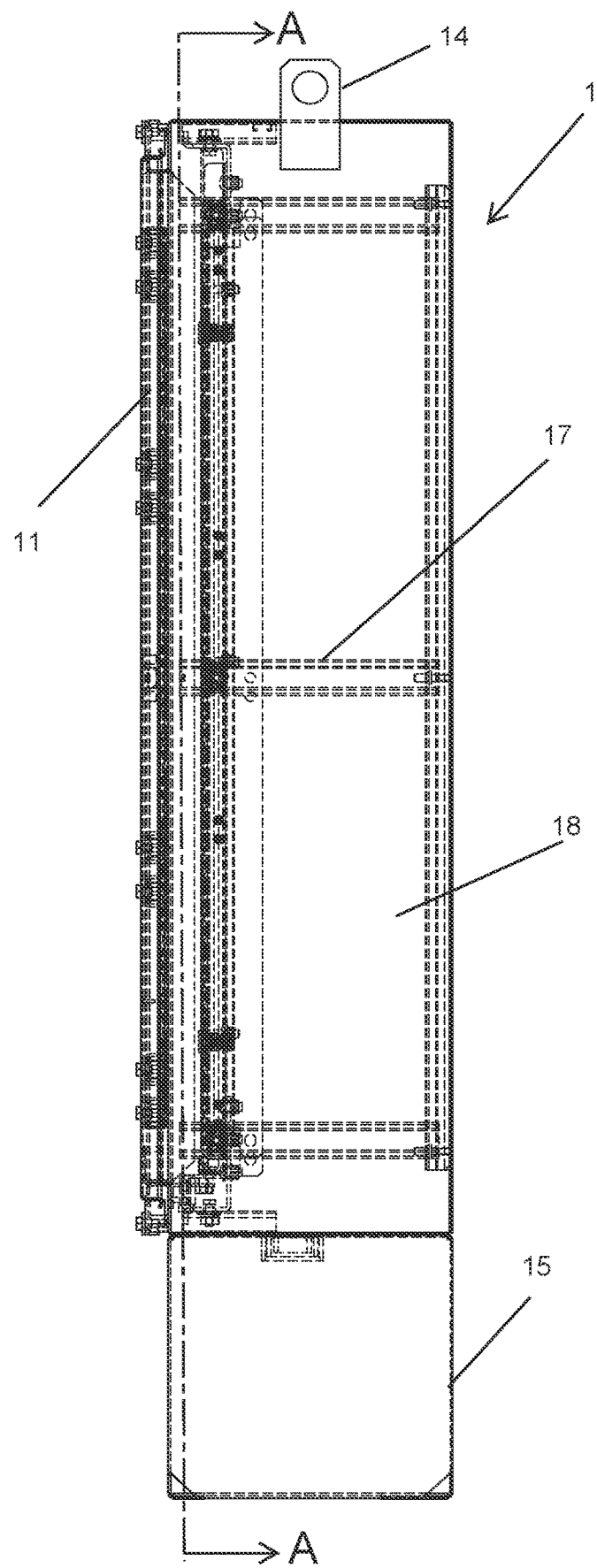
FIG. 3 shows a side view of the submersible control panel.
Figure 4:
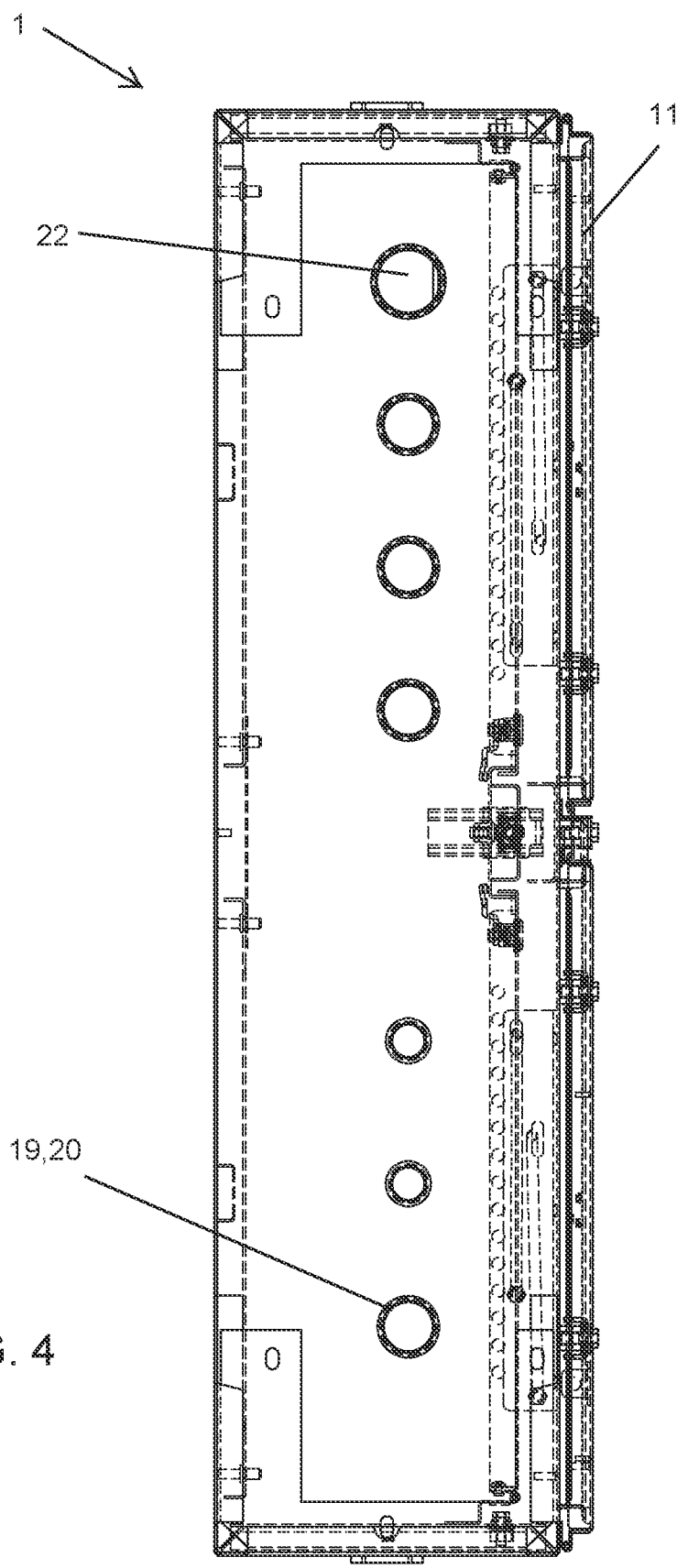
FIG. 4 is a bottom view of the submersible control panel without the floor stands in place.
Figure 5:
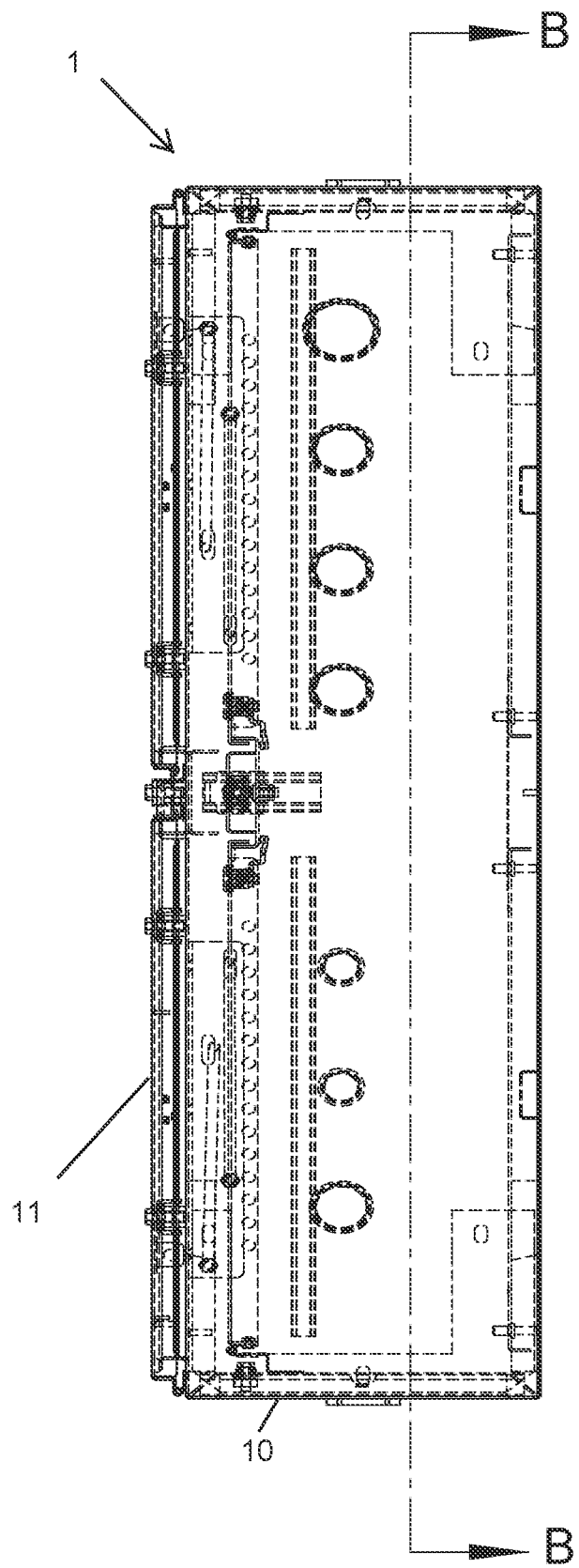
FIG. 5 is a top view of the submersible control panel.
Figure 6:
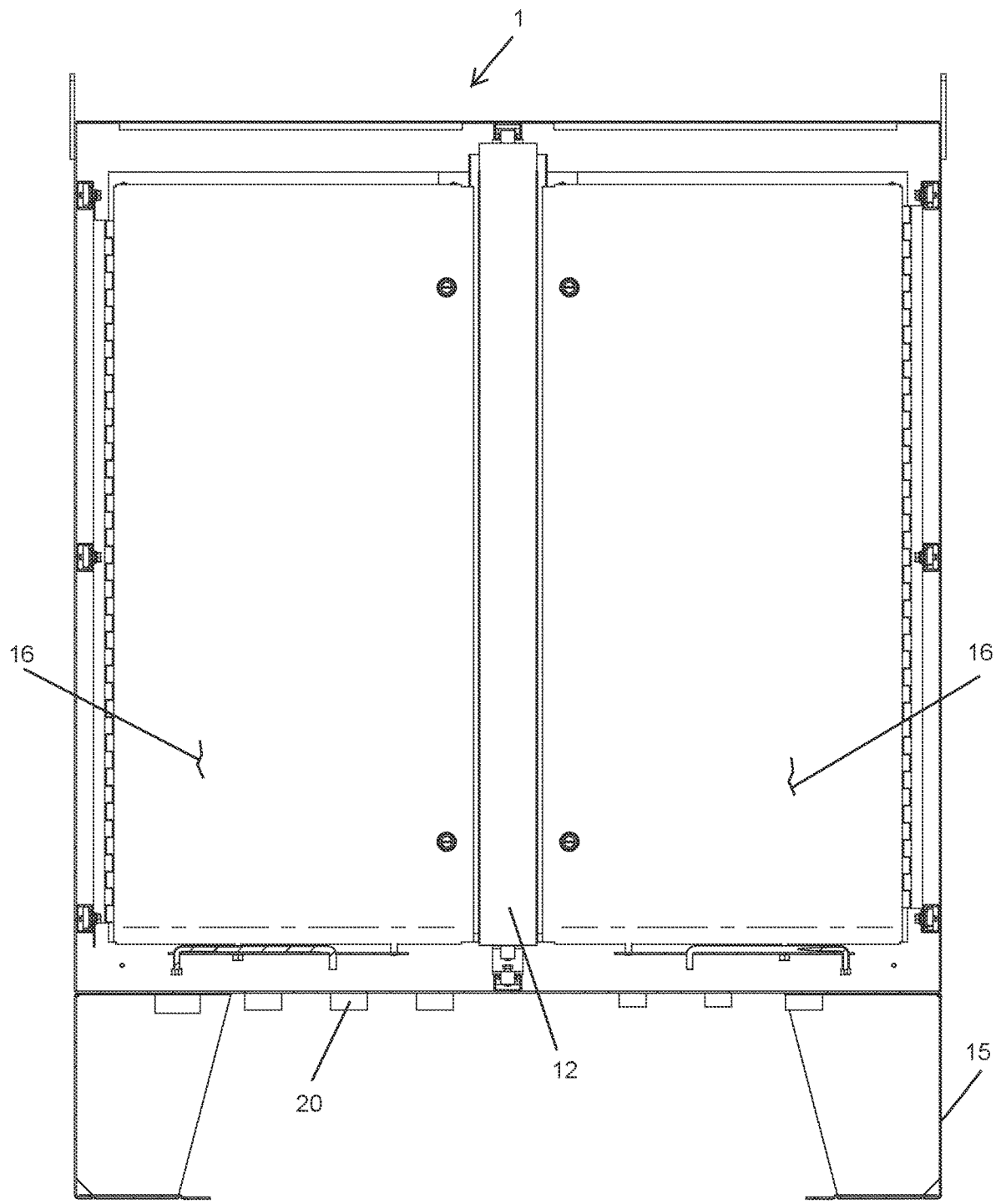
FIG. 6 is a section view of the submersible control panel along A-A of FIG. 3.

The interior of the control panel 1 includes inner doors 16 mounted on rails 17 disposed on sidewalls 18 as shown in FIGS. 3 and 6, where FIG. 6 is a section taken behind the outer doors 11. The inner doors 16 may be aluminum. The inner doors 16 can be slid depth wise into and out of the panel 1 to accommodate breakers that are disposed behind the inner doors 16 and which are provided to operate the station. The inner doors 16 allow maintenance of electrical control components (disposed in front of the inner doors) without the inner doors having to be opened and to allow a service person not be required to employ PPE (Personal Protection Equipment) requirements by NEC code. The set distance on the rails 17 for the inner doors 16 from the back wall is determined by the required breakers that are mounted in the behind the inner doors 16 and this distance varies according to the frame size of the breakers disposed in the control panel 1.

The base of the body is provided with connection openings 19. The connection openings 19 have connection hubs 20 that are welded water-tight to the openings 19. The hubs 20 are stainless steel and are threaded for connection of rigid conduits 21, which each have a mating thread corresponding to the threads on the corresponding hub 20. The conduits are preferably 16" in length. A PTFE tape can be used at the threaded connections between the hubs 20 and the conduits 21 to improve the seal. The rigid conduits 21 can be "steel rigid metal conduit" as provided by Wheatland Tube, which are hot-dip galvanized steel tubes. Any hubs 20 not required for wiring requirements of the panel 1 are provided with a threaded plug 22 that seals the hub 20 in a water-tight manner. The plug 22 and hub 20 connection can also be provided with the thread tape for ensuring the sealing of the plug 22 to the hub 20.

Figure 7:
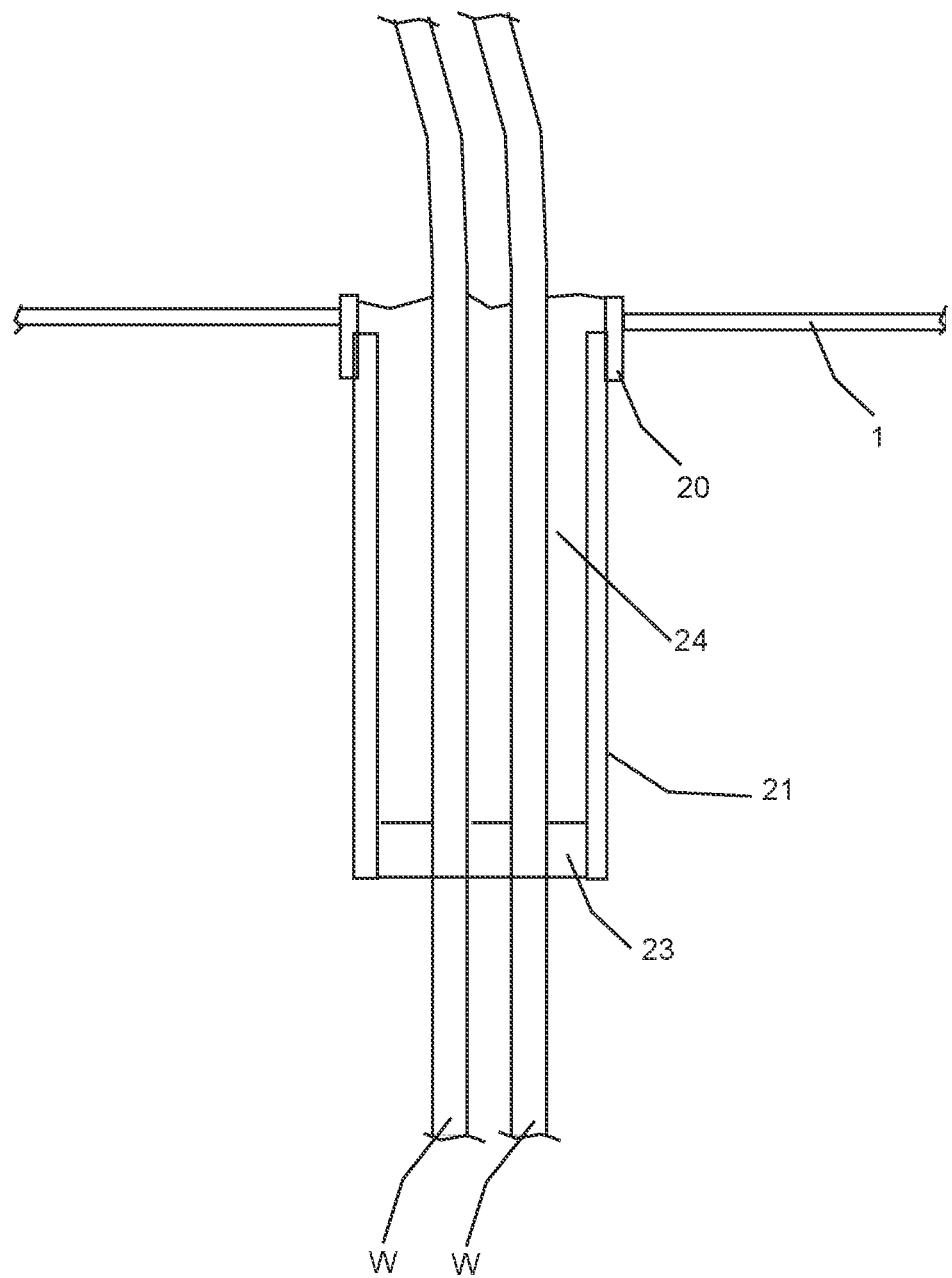
FIG. 7 is an enlarged section view of the submersible control panel through an electrical connection for the panel.
Figure 8:
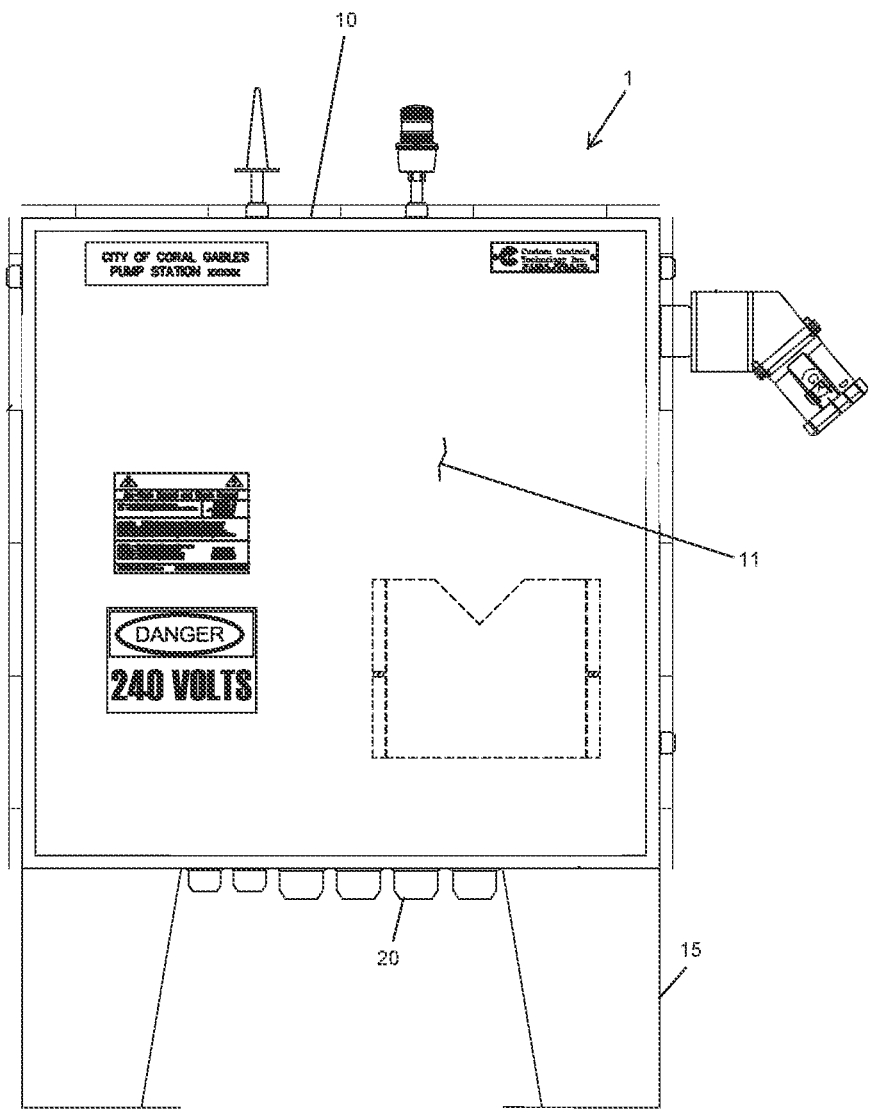
FIG. 8 is a front view of a submersible control panel with a single door according to the invention.
Figure 9:
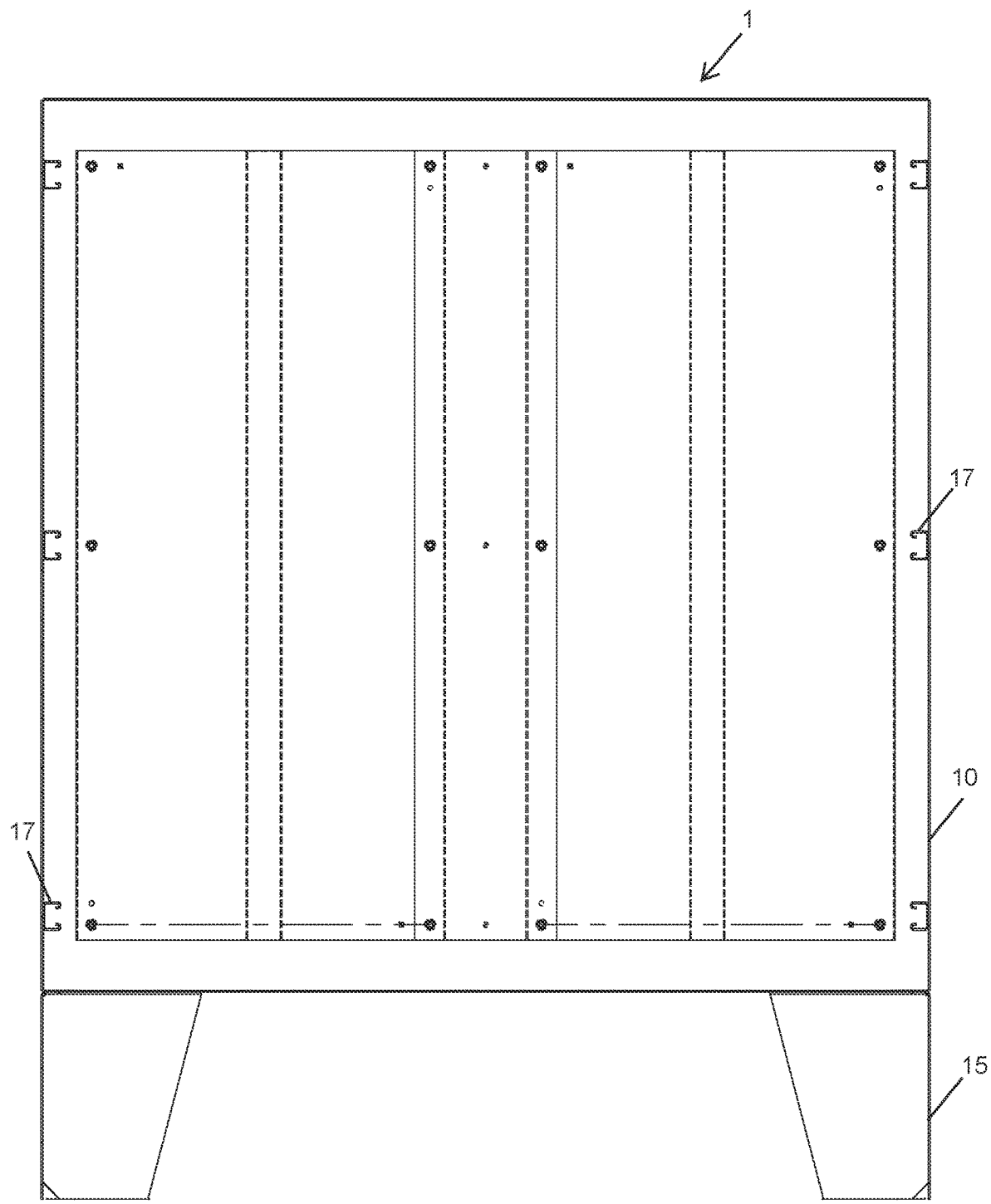
FIG. 9 is a section view of the submersible control panel along B-B of FIG. 5.

FIG. 7 shows an enlarged section of the hub area of the panel. As shown in FIG. 7, the bottom of the conduit 21 is provided with a porous material damper 23 such as a sponge 23 that conforms to the inside diameter of the conduit 21 and preferably has a length of 1.5 inches in the longitudinal direction of the conduit 21, which preferably has a length of 16 inches. The wiring W for the hub 20 is passed through the sponge 23 by simply being pierced through the sponge 23. An epoxy 24 is provided in the conduit 21 and saturates the sponge 23 and is hardened to seal the conduit 21 to the wires W over the longitudinal extent of the sponge 23 and above the sponge 23 to the height which the epoxy is filled. A suitable epoxy is EPIC R1074-06/H4030-02, which is a premium fire retardant epoxy potting compound from EPIC RESINS, but the epoxy is not limited to such as any comparable epoxy may be used. The sponge 23 serves as a damper in the conduit to prevent the liquid epoxy from running out of the conduit 21 and allows the epoxy 24 to set without running out of the conduit 21. A suitable sponge is the type used in packaging for reducing impact during shipping, but is not limited to such material. The sponge needs to have the material properties that allow for the wiring to be pierced through the sponge 23, which provides for a tight fit between the sponge 23 and the wires W. The porosity of the sponge material is selected to minimize the flow through of the epoxy, while still allowing the sponge to become saturated before the epoxy begins to set. Alternatively, the porous material damper 23 can be provided a spray foam 23 that is applied at the bottom end of the conduit 21. A suitable foam is Fire Block Foam by 3M® with the manufacturer ID: FB-Foam-Orange, but is not limited to such foam.

The body is also provided with lifting lugs 14 that allow for rigging to place the control panel 1.

The method of providing the connection of the conduits 21 onto the hubs 20 is described with respect to FIG. 7. The required wires W for a respective hub 20 are pierced through the sponge 23 and fed through until the required length to connect to the corresponding control component(s) in the panel 1 is reached. The wires are fed through the conduit 21 and the conduit 21 is threaded onto the corresponding hub 20. The sponge 23 is inserted into the lower end of the conduit 21 and engages the inside diameter of the conduit 21. The epoxy 24 is filled into the connected conduit 21 and allowed to cure. If the porous material 23 is provided as the spray foam, the wires W are passed through the conduit to the required amount. The foam is sprayed into the bottom of the conduit and then the epoxy 24 is filled into the conduit 21.

The method and construction of the invention provides for the water-tight submersible panel that is made water-tight at the installation site at the time of connection and thus allows for the electrical connection of the panel in a precise and reliable way.

Once the flood waters have resided, the control panel 1 maintains operation with no structural changes or modifications, nor is there a need of any special panels to guarantee the sealing of the control panel 1 as it is installed in a water-tight manner. The control system will be able to function and provide municipalities with full confidence that their "Lift Sewage or Storm Pump Stations" are fully functional and free of any electrical hazard. Thus, the submersible control panel 1 provides normal functionality and ability for residents after a severe, storm or hurricane.

The control panel 1 withstands 175 mph wind tests and maintains water-tightness when submersed at 6 feet+ and still function at 100%.

The invention claimed is:

1. A submersible control system being submersible under six feet of water for 24 hours and prevent water intrusion, the system comprising:
   a control panel having:
      a frame for housing electronic components said frame having a connection opening for wiring required for an electrical connection to the electrical components;
      an outer door attached to said frame for being water-tight to said frame in a closed position thereof; and
      a conduit sealed for being water-tight with respect to said connection opening, said conduit being filled with an epoxy for water-tight sealing an interior of said conduit to the wiring fed through said conduit.

2. The submersible control system according to claim 1, wherein said connection opening has a hub welded onto said frame to be water-tight to said frame, said conduit has a threaded connection to said hub.

3. The submersible control system according to claim 1, further comprising a porous material disposed in said conduit at a bottom end of said conduit, said porous material defining a damper for preventing said epoxy from flowing out of said conduit during filling of said epoxy into said conduit.

4. The submersible control system according to claim 3, wherein said porous material is a sponge that engages an inside diameter of said conduit.

5. The submersible control system according to claim 4, wherein said sponge has material properties configured to allow the wires to be pierced through said sponge.

6. The submersible control system according to claim 1, further comprising an inner door disposed inside said control panel, said inner door dividing an interior of said control panel and defining an area behind said inner door for isolating high-voltage components of the control panel.

7. The submersible control system according to claim 6, further comprising rails disposed on a sidewall of said frame, said rails adjustably mounting said inner door in a front to back direction of said control panel.

8. The submersible control system according to claim 1, further comprising legs disposed on a base side of said frame in which said connection opening is formed.

9. The submersible control system according to claim 8, wherein said legs have a base side with holes formed therein.

10. The submersible control system according to claim 8, wherein said legs elevate said base side of said frame from a support surface.

11. A method of providing a submersible control system being submersible under six feet of water for 24 hours and preventing water intrusion, the method comprising:
   providing a water-tight control panel having a frame for housing electronic components said frame having a connection opening for electrical wiring required for an electrical connection to electrical components;
   an outer door attached to the frame for being water-tight to the frame in a closed position thereof;
   providing a conduit and passing electrical wiring through the conduit;
   connecting the conduit to the opening and sealing the conduit at the opening with a water-tight connection;
   filling the conduit with epoxy and sealing the interior of the conduit to the electrical wiring with a water-tight sealing.

12. The method of providing a submersible control system according to claim 11, further comprising:
   prior to the filling step:
      providing a porous material damper;
      piercing the wiring through the porous material damper;
      inserting the porous material damper into the conduit and engaging an inside diameter of the conduit therewith.

13. The method of providing a submersible control system according to claim 11, further comprising:
   prior to the filling step:
      providing a porous material damper as a sprayable foam;
   spraying the porous material damper into the bottom end of the conduit around the wiring and filling a gap between the wiring and an inside diameter of the conduit.

* * * * *